(12) United States Patent
Noh et al.

(10) Patent No.: US 10,707,990 B2
(45) Date of Patent: Jul. 7, 2020

(54) METHOD FOR CHANNEL CODING IN WIRELESS COMMUNICATION SYSTEM AND APPARATUS THEREFOR

(71) Applicant: LG ELECTRONICS INC., Seoul (KR)

(72) Inventors: Kwangseok Noh, Seoul (KR); Hyunsoo Ko, Seoul (KR); Dongkyu Kim, Seoul (KR); Sangrim Lee, Seoul (KR); Hojae Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/580,538

(22) PCT Filed: Jun. 10, 2015

(86) PCT No.: PCT/KR2015/005828
§ 371 (c)(1),
(2) Date: Dec. 7, 2017

(87) PCT Pub. No.: WO2016/199954
PCT Pub. Date: Dec. 15, 2016

(65) Prior Publication Data
US 2018/0175967 A1    Jun. 21, 2018

(51) Int. Cl.
*H04L 1/00* (2006.01)
*H04L 1/16* (2006.01)
(Continued)

(52) U.S. Cl.
CPC ............ *H04L 1/001* (2013.01); *H03M 13/35* (2013.01); *H03M 13/353* (2013.01);
(Continued)

(58) Field of Classification Search
CPC ......... H04L 1/001; H04L 1/00; H04L 1/0025; H04L 1/0068; H04L 1/0071;
(Continued)

(56) References Cited

U.S. PATENT DOCUMENTS 6,166,667 A * 12/2000 Park ...................... H03M 13/23
341/51
2003/0117941 A1 * 6/2003 Lundby ............... H04J 13/0048
370/209

(Continued)

OTHER PUBLICATIONS

IEEE 100, The authoritative Dictionary of IEEE Standards Terms, Seventh Edition, IEEE Standards, pp. 157, 197, 240, 337, 934, 1051, 1210, 1240, 1282 (Year: 2000).*

(Continued)

*Primary Examiner* — April Y Blair
*Assistant Examiner* — Dipakkumar B Gandhi
(74) *Attorney, Agent, or Firm* — Birch, Stewart, Kolasch & Birch, LLP

(57) ABSTRACT

The present invention relates to a method for performing channel encoding by a transmitting end in a wireless communication system. Particularly, the method comprises the steps of: transmitting, to a receiving end, a configuration indicating a plurality of channel coding configurations; performing channel encoding using a first channel coding configuration among the plurality of channel coding configurations; and performing reconfiguration from the first channel coding configuration to a second channel coding configuration according to a change in system requirements, wherein the plurality of channel coding configurations comprise channel coding configurations, each comprising at least one channel code concatenated differently according to the system requirements.

3 Claims, 5 Drawing Sheets

(51) Int. Cl.
*H03M 13/35* (2006.01)
*H03M 13/00* (2006.01)
*H04L 5/06* (2006.01)
*H03M 13/09* (2006.01)
*H03M 13/27* (2006.01)
*H03M 13/11* (2006.01)
*H03M 13/29* (2006.01)
*H04W 4/40* (2018.01)
*H04W 4/06* (2009.01)
*H04L 1/18* (2006.01)
*H03M 13/23* (2006.01)
*H03M 13/39* (2006.01)

(52) U.S. Cl.
CPC .......... *H03M 13/6513* (2013.01); *H04L 1/00* (2013.01); *H04L 1/0009* (2013.01); *H04L 1/0041* (2013.01); *H04L 1/0065* (2013.01); *H04L 1/0068* (2013.01); *H04L 1/0071* (2013.01); *H04L 1/0075* (2013.01); *H04L 1/16* (2013.01); *H03M 13/09* (2013.01); *H03M 13/1194* (2013.01); *H03M 13/23* (2013.01); *H03M 13/2739* (2013.01); *H03M 13/2778* (2013.01); *H03M 13/2906* (2013.01); *H03M 13/2957* (2013.01); *H03M 13/3938* (2013.01); *H04L 1/0025* (2013.01); *H04L 1/1867* (2013.01); *H04W 4/06* (2013.01); *H04W 4/40* (2018.02)

(58) Field of Classification Search
CPC ........ H04L 1/0075; H04L 1/16; H03M 13/35; H03M 13/353; H03M 13/6513; H03M 13/09; H03M 13/1194; H03M 13/23; H03M 13/2739; H03M 13/2778; H03M 13/2906; H03M 13/2957; H03M 13/3938; H04W 4/06; H04W 4/40
See application file for complete search history.

(56) References Cited

U.S. PATENT DOCUMENTS

| | | | |
|---|---|---|---|
| 2004/0037569 A1* | 2/2004 | Kamalov | H04B 10/07953 398/162 |
| 2005/0149842 A1 | 7/2005 | Kyung et al. | |
| 2006/0182196 A1* | 8/2006 | Shashidhar | H04B 7/0669 375/267 |
| 2008/0118003 A1* | 5/2008 | Liu | H04L 1/0618 375/298 |
| 2009/0141793 A1 | 6/2009 | Gramelspacher et al. | |
| 2009/0228763 A1 | 9/2009 | Wang | |
| 2009/0292842 A1* | 11/2009 | Fothergill-Zittrer | G06F 13/387 710/106 |
| 2010/0002692 A1* | 1/2010 | Bims | H04L 1/0009 370/389 |
| 2010/0210278 A1* | 8/2010 | Huang | H04L 1/1657 455/452.1 |
| 2010/0260266 A1* | 10/2010 | Gholmieh | H04L 1/005 375/240.25 |
| 2010/0303171 A1 | 12/2010 | Tong et al. | |
| 2012/0120882 A1* | 5/2012 | Luo | H04L 5/0053 370/329 |
| 2013/0242842 A1* | 9/2013 | Wong | H04L 1/0061 370/312 |
| 2014/0211708 A1* | 7/2014 | Zhao | H04L 1/1854 370/329 |
| 2015/0043396 A1* | 2/2015 | Ekpenyong | H04L 5/1469 370/280 |

OTHER PUBLICATIONS

Somekh-Baruch, Cooperative Multiple-Access Encoding with States Available at One Transmitter, IEEE, vol. 54, Issue:10, pp. 4448-4469 (Year: 2008).*

* cited by examiner

000
METHOD FOR CHANNEL CODING IN WIRELESS COMMUNICATION SYSTEM AND APPARATUS THEREFOR

CROSS REFERENCE TO RELATED APPLICATIONS

This application is the National Phase of PCT International Application No. PCT/KR2015/005828, filed on Jun. 10, 2015, all of which are hereby expressly incorporated by reference into the present application.

TECHNICAL FIELD

The present invention relates to a wireless communication system, and more particularly, to a channel coding method using a channel code selected based on a data transmission environment, data type, and the like in a wireless communication system and apparatus therefor. Further, the present invention includes an encoding selection scheme at a transmitting end and decoding selection scheme at a receiving end in accordance with channel code selection.

BACKGROUND ART

Generally, in a communication system, a transmission end of the communication system encodes transmission information using a forward error correction code, and transmits the encoded information to a reception end of the communication system, such that errors caused by a channel can be corrected in the information received in the reception end. The reception end demodulates a reception signal, decodes a forward error correction code, and recovers the transmission information transferred from the transmission end. During this decoding process, reception signal errors caused by a channel can be corrected.

There are various kinds of forward error correction codes that may be used. For the convenience of description, a turbo code will hereinafter be described as an example of the forward error correction code. The turbo code includes a recursive systematic convolution encoder and an interleaver. In case of actually implementing the turbo code, the interleaver facilitates parallel decoding, and an example of this interleaver may be a quadratic polynomial permutation (QPP) interleaver. It is well known in the art that this QPP interleaver maintains a superior throughput or performance in only a specific-sized data block. In this case, the term "data block" is block unit data encoded by the encoder. If we think block unit data transferred from an upper layer to a physical layer is encoded without segmentation discussed below, this data block may also be called as a transport block (TB). On the other hand, if we think the segmentation of the transport block to be encoded, this data block may be matched to "a code block".

In general, the larger the data-block size, the higher the turbo-code performance. A data block of more than a specific size is segmented into a plurality of small-sized data blocks by an actual communication system, such that the small-sized data blocks are encoded for the convenience of actual implementation. The divided small-sized data blocks are called code blocks. Generally, although these code blocks have the same size, one of several code blocks may have another size due to the limitation of the QPP interleaver size. A forward error correction coding process on the basis of a code block of a predetermined interleaver size is performed on the small-sized data blocks, and the resultant data blocks are then transferred to an RF (Radio Frequency) channel. In this case, a burst error may occur in the above process of transferring the resultant data blocks to the RF channel, such that the above resultant data blocks are interleaved to reduce an influence of the burst error. The interleaved data blocks are mapped to actual radio resources, such that the mapped result is transferred.

An amount of radio resources used in an actual transmission process is constant, such that a rate matching process should be performed on the encoded code blocks due to the constant amount of radio resources. Generally, the rate matching process is implemented by a puncturing or a repetition. For example, the rate matching may also be performed on the basis of an encoded code block in the same manner as in a WCDMA of the 3GPP. For another example, a systematic part and a parity part of the encoded code block may be separated from each other. The rate matching process may be performed on the systematic part and the parity part together. On the other hand, the rate matching process may also be independently performed on each of the systematic part and the parity part.

FIG. 1 is a conceptual diagram illustrating basic operations of a turbo encoder.

As shown in FIG. 1, if a turbo-encoder receives one code block, it divides the received one code block into a systematic part (S) and parity parts (P1 and P2). The systematic part S and the parity parts P1 and P2 pass through individual sub-block interleavers, respectively. Thus, the systematic part S and the parity parts P1 and P2 may be interleaved by different sub-block interleavers, and the interleaved result is stored in a circular buffer.

As can be seen from FIG. 1, the systematic part and the parity parts of the code block may be separated from each other, and the rate matching process is performed on the individual separated parts, but the example of FIG. 1 has been disclosed for only illustrative purposes and the scope and spirit of the present invention are not limited to this example and can also be applied to other examples. For the convenience of description, it is assumed that a code rate is a value of ⅓.

Although a variety of transport block sizes may be defined according to service categories of an upper layer, it is preferable that the transport block sizes may be quantized to effectively perform the signaling of various transport block sizes. During the quantization process, in order to adjust a source data block transferred from an upper layer to the size of a data block of a physical layer, a dummy bit is added to the source data block. During this quantization process, it is preferable to minimize the amount of added dummy bits.

Further, the use of channel codes is necessary not only in a communication system such as the long term evolution (LTE) system but also in a broadcasting system. As a general configuration method for channel codes, a transmitting end performs encoding on an input symbol using an encoder and then transmits the encoded symbol, and a receiving end performs decoding on the encoded symbol to restore the input symbol.

In addition, since a channel code has different performance depending on its characteristics, the LTE system uses various channel codes according to data types. For example, the LTE system uses a tail biting convolution code (TBCC) for a broadcast channel (BCH), downlink (DL) control information, etc. In addition, when a large amount of data is transmitted like a PDSCH, and PUSCH, the LTE system uses a turbo code (TC). When a small amount of important data is transmitted like a CQI/PMI in the PUSCH and PUCCH format 3, the LTE system uses an RM(32,O) block code.

FIG. 2 is a reference diagram for explaining a repetition accumulate (RA) code. Among channel codes, a concatenated code such as the RA code goes through two simple forms of encoders and a single piece of processing (permutation) equipment between the two encoders. The performance of the RA code may be similar to that of the turbo code, but in the same situation, the complexity of the RA code can be significantly reduced compared to that of the turbo code. In the case of a concatenated form of a code, as the number of sub-codes in the code increases and the performance of each of the sub-codes increase, the overall performance of the concatenated code is improved.

DISCLOSURE OF THE INVENTION

Technical Task

Based on the above-described discussion, the present invention proposes a channel coding method for a wireless communication system and apparatus therefor.

It will be appreciated by persons skilled in the art that the objects that could be achieved with the present invention are not limited to what has been particularly described hereinabove and the above and other objects that the present invention could achieve will be more clearly understood from the following detailed description.

Technical Solutions

To achieve these objects and other advantages, in an aspect of the present invention, provided herein is a channel encoding method for a transmitting end in a wireless communication system, including: transmitting, to a receiving end, a configuration indicating a plurality of channel coding configurations; performing channel encoding using a first channel coding configuration among the plurality of channel coding configurations; and reconfiguring a channel coding configuration from the first channel coding configuration to a second channel coding configuration according to a change in system requirements, wherein the plurality of channel coding configurations may include channel coding configurations, each of which includes one or more channel codes concatenated differently according to the system requirements.

Additionally, the system requirements may include at least one of a target bit error rate, latency, a data type, a data size, a code rate, and reliability.

Additionally, the system requirements change may be informed the receiving end through a downlink control channel, an uplink control channel, or higher layer signaling.

Additionally, the system requirements change may be informed through one of a target bit error rate, a code index, and an index difference value between an index of the first channel coding configuration and an index of the second channel coding configuration. Further, the code index may indicate a specific combination of channel codes for each of the plurality of channel coding configurations. In this case, it is preferred to configure the code index to further indicate information on a code rate according to the specific combination.

Additionally, reconfiguring may be performed when system requirements of at least one of the transmitting and receiving ends are changed.

Additionally, reconfiguring may be performed when the receiving end feeds back negative acknowledgement (NACK) during a predetermined unit time.

In another aspect of the present invention, provided herein is a channel decoding method for a receiving end in a wireless communication system, including: receiving, from a transmitting end, a configuration indicating a plurality of channel coding configurations; and performing channel decoding using a specific channel coding configuration among the plurality of channel coding configurations, wherein the plurality of channel coding configurations may include channel coding configurations, each of which includes one or more channel codes concatenated differently according to system requirements, and wherein the specific channel coding configuration may be reconfigured according to a change in the system requirements.

Advantageous Effects

According to embodiments of the present invention, channel coding can be efficiently performed in a wireless communication system.

It will be appreciated by persons skilled in the art that the effects that can be achieved through the present invention are not limited to what has been particularly described hereinabove and other advantages of the present invention will be more clearly understood from the following detailed description.

DESCRIPTION OF DRAWINGS

The accompanying drawings, which are included to provide a further understanding of the invention and are incorporated in and constitute a part of this specification, illustrate embodiments of the invention and together with the description serve to explain the principles of the invention.

BEST MODE FOR INVENTION

Hereinafter, the preferred embodiments of the present invention will be described with reference to the accompanying drawings. It is to be understood that the detailed description which will be disclosed along with the accompanying drawings is intended to describe the exemplary embodiments of the present invention, and is not intended to describe a unique embodiment which the present invention can be carried out.

The following detailed description includes specific details in order to provide a thorough understanding of the present invention. However, it will be apparent to those skilled in the art that the present invention may be practiced without such specific details. In some instances, known structures and devices are omitted or are shown in block diagram form, focusing on important features of the structures and devices, so as not to obscure the concept of the present invention.

As described above, it has been known that the interleaver within the turbo code shows excellent performance only in a specific data block size. That is, when a size of a data block is equal to or greater than a prescribed value, the data block needs to be segmented into a plurality of code blocks. However, due to the above-described limitation of an interleaver size, it may not be segmented into code block with the same size.

However, considering that a channel quality indicator should be equally applied to all code blocks segmented from the data block, the data block is preferred to be segmented such that the code blocks have the same size. In addition, when the data block size or the segmented code block size is different from the interleaver size within the turbo code, a dummy bit is inserted, and this may degrade transmission efficiency. Therefore, it is preferred to configure the data block size or the segmented code block size such that the dummy bit is not inserted.

To this end, an input bit length of the internal interleaver of the turbo encoder, which is the direct cause of the inserted dummy bit, should be considered. In addition, when CRCs are attached to a transport block and code blocks segmented from the transport block, a data block length may be changed. Thus, this should also be considered.

First, the above-described process in which a CRC is attached will be described.

For error detection, the CRC may be attached to the transport block transmitted from a higher layer, and it may also be attached to individual code blocks segmented from the transport block for convenience of implementation.

Figure 3:
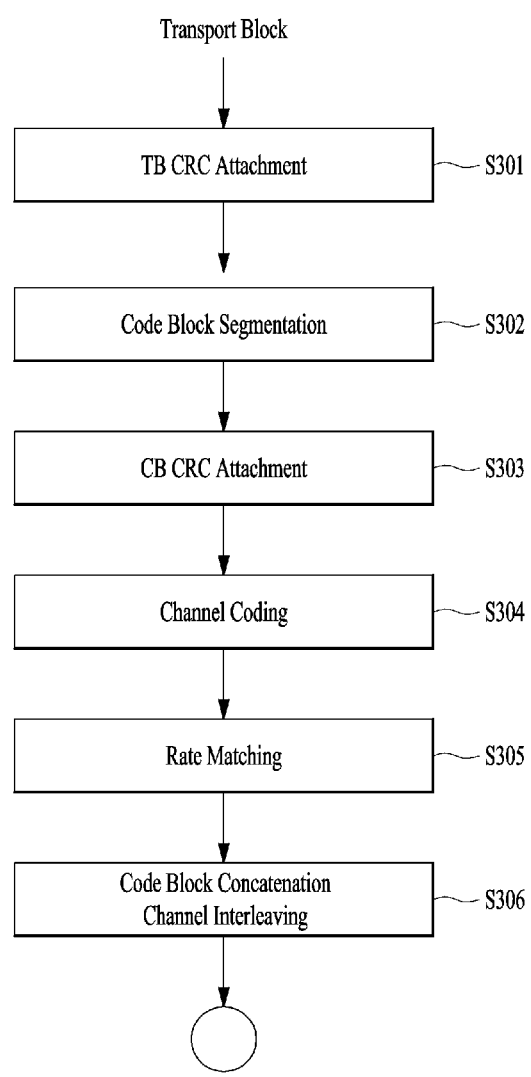
FIGS. 3 and 4 are diagrams for schematically explaining a process of the 3GPP LTE system in which a long length of a transport block is segmented into short lengths of code blocks and then CRCs are attached thereto.
Figure 4:
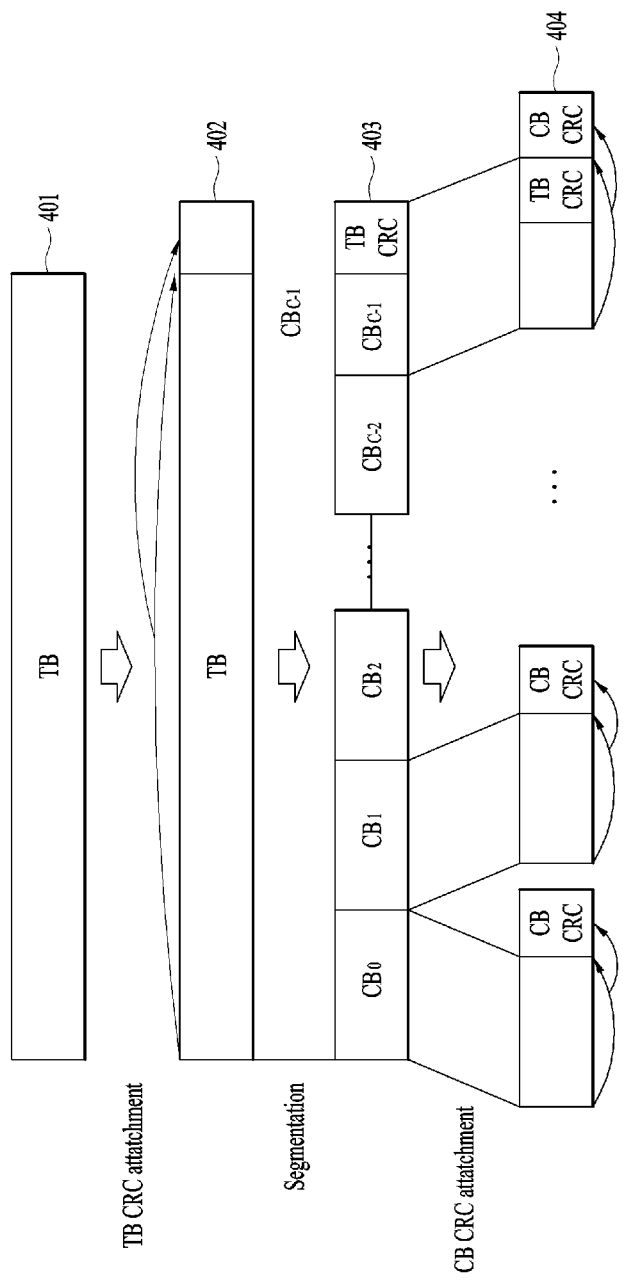

FIGS. 3 and 4 are diagrams for schematically explaining a process of the 3GPP LTE system in which a long length of a transport block is segmented into short lengths of code blocks and then CRCs are attached thereto.

In the 3GPP system, a long length of a transport block (TB) is segmented into short lengths of code blocks (CBs), and then an encoding process is performed on each of the plurality of CBs with short lengths. Thereafter, the plurality of CBs are combined and then transmitted. This process will be described in detail with reference to steps of FIG. 3.

First, a long length of a TB goes through a CRC encoding process, and then a CRC is attached to the TB [S301]. Next, the full length of the TB where the CRC is attached is segmented into a plurality of CBs with short lengths [S302]. The steps in which the CRC is attached to the long length of the TB and then the TB where the CRC is attached is segmented into the plurality of CBs are depicted in drawing numbers 401 to 403 of FIG. 4. However, if a length of a TB transmitted from a higher layer is equal to or shorter than a prescribed length capable of implementing a single code block, more specifically, the maximum length of the internal interleaver of the turbo encoder (e.g., in the 3GPP LTE system, the maximum length is 6144 bits), the process for TB segmentation can be omitted, and in this case, the process for CB CRC attachment can also be omitted.

Meanwhile, the short lengths of the CBs go through CRC attachment process after passing through the CRC encoding process again [S303]. That is, each of the CBs includes the CRC as shown in drawing number 204 of FIG. 4.

In addition, the CBs where CRCs are attached are inputted to a channel encoder and then go through a channel coding process [S304]. Thereafter, each code block goes through a rate match process [S305] and a code block concatenation and channel interleaving process [S306] and then is transmitted to a receiving end.

Further, in the next-generation (5G) wireless communication system, various transmission scenarios and data types based on various channels such as a PDSCH, PUSCH, etc. have been considered. On the other hand, in the legacy LTE system, it was explicitly defined that only the turbo code is used as a channel code applied to the PDSCH and PUSCH. However, in the 5G system, various data sizes, which will be transmitted, and error rate requirements can be defined according to the transmission scenarios and data types, and thus various conditions for channel codes can be added to satisfy the corresponding requirements.

For example, in the case of machine-type communication (MTC), the turbo code (TC) may be used to satisfy requirements for data with an average/mean size among data sizes that can be supported by the MTC and high reliability. For data with a small size among the data sizes that can supported by the MTC and high latency, the tail bit convolutional code (TBCC) may be used. As another example, regarding data with a high target error rate and low latency, a convolutional code may be used in consideration of decoding complexity.

Further, in the case of a concatenated form of a code such as the RA code, the entirety of the code is used instead of using a part of that, similar to the turbo code of the LTE system.

Therefore, by considering the aforementioned data transmission in the various situations, a plurality of channel codes can be used for the PDSCH/PUSCH transmission. In the present invention, an indication method regarding the use of multiple channel codes will described in detail.

Figure 5:
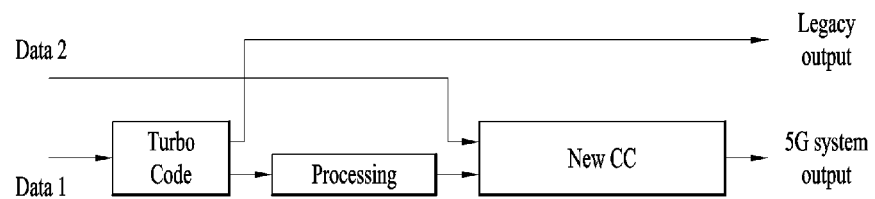
FIG. 5 illustrates an encoder structure capable of using various codes based on the turbo code used in the LTE system.

FIG. 5 illustrates an encoder structure capable of using various codes based on the turbo code used in the LTE system. When there are several types of data (e.g., data 1 and data 2 shown in FIG. 5), whether some or all of multiple channel codes will be used can be determined to satisfy QoS, a target bit error rate (hereinafter abbreviated as a target BER), and latency of each piece of data Thus, to support the legacy LTE wireless communication system, an encoded symbol (i.e., legacy codeword) that passes through only the turbo code may be outputted. In addition, for data that has low requirements regarding latency (i.e., low latency) but requires high reliability, a codeword can be generated by applying the turbo code, processing, and a new channel code (hereinafter abbreviated as a new CC).

For example, a scheme related to the new CC may include the existing scheme related to the repetition code or convolution code or a new coding scheme. For instance, if the new CC has performance lower than that of the turbo code but achieves a high decoding speed or requires low power, data 2 through only the new CC may be MTC data.

In addition, by changing performance of an applied code according to specific performance requirements, the performance requirements can be satisfied. For example, assuming that target BERs of the turbo code, new CC, and turbo code+new CC are $10^{-3}$, $10^{-2}$, and $10^{-5}$ respectively, and processing is an interleaver, a channel code can be selected and used according to a target BER. In this case, although processing may play a role of the interleaver that mixes data locations similar to the use of a permutation matrix, a new form of code can be formed by combining with the turbo code.

Moreover, although not shown in FIG. 5, as another example of the encoder structure, if a repetition code is used as processing, it is possible to form a code capable of improving performance while maintaining low complexity by combining with the new CC (however, in this case, overhead may be increased).

According to an embodiment of the present invention, a procedure for selecting a specific one from various channel codes can be performed as follows.

1. First, a transmitting transmits a signal by performing channel encoding using a target BER predetermined between transmitting and receiving ends or a default configuration. In this case, the target BER or default configuration may be informed through a PDCCH, PUCCH or higher layer signaling (e.g., RRC signaling). Alternatively, it may be determined in advance between the transmitting and receiving ends. Since the PDCCH and PUCCH does not use various channel codes, they can be used to transmit a common configuration for systems with different requirements by using a robustly designed channel. Further, according to the present invention, for the target BER, latency, or other functions, a table/chart/list may be predetermined between the transmitting and receiving ends, or a predefined table/chart/list may be signaled.

2. The receiving end receives a signal by performing channel decoding according to configured situations (e.g., transmission scenario, data type, latency, target BER, etc.).

3. If the requirements for performance or latency are changed, the transmitting end transmits i) the target BER or ii) a code index that should be used through a channel where various channel codes are not used (e.g., PDCCH, PUCCH) or higher layer signaling.

Here, the code index indicates a value for code configurations that can be combined. For example, when only the turbo code is used, the index may be set to 1. When the turbo code+processing+new CC are applied, the index may be set to 2. When only the new CC is applied, the index may be set to 3. Alternatively, an index difference value between the currently used code indices may be transmitted.

In addition, the code index may indicate a combination of configured codes and it may also include information on a code rate of each code. Alternatively, it is possible to configure and transmit a new index for the code index for the configured code combination and the code rate.

In this case, if the target BER is changed, for example, the target BER is changed from $10^{-3}$ to $10^{-5}$, a code configuration is reconfigured from the index 1 (i.e., the use of the turbo code) to the index 2 (i.e., turbo+processing+new CC) using a table shared between the transmitting and receiving ends, which shows a relationship between code indices, even when the target BER is transmitted.

4. When NACK occurs at the receiving end, the transmitting end can change the target BER by considering statistics related to NACK during N unit times (where N is a natural number). For example, in the LTE system, since there is no change in the target BER, N may become ∞ (N=∞). In addition, when extreme low latency is required, i.e., retransmission cannot be performed, N may be set to 1 (N=1). That is, when NACK occurs, the target BER can be immediately reduced and then used. Further, when the target BER is changed, a code rate of the corresponding code is changed, or the currently used code index may be changed.

Figure 6:
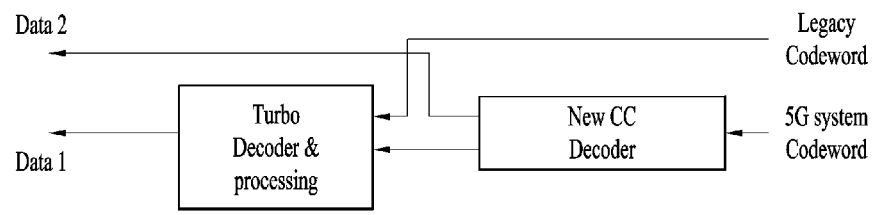
FIG. 6 illustrates a decoder structure for restoring original data by receiving codewords generated by the encoder shown in FIG. 5.

FIG. 6 illustrates a decoder structure for restoring original data by receiving codewords generated by the encoder shown in FIG. 5.

Additionally, in FIG. 5, when 5G system output is constructed in the systematic form, a receiving end can select some sequentially concatenated codes from among a plurality of codes, which are used as systematic forms of codes, and then perform decoding on the codes.

Figure 7:
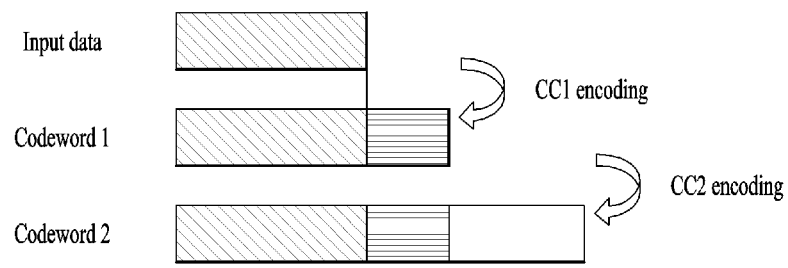
FIG. 7 is a reference diagram for explaining the application of the present invention regarding a systematic code.

FIG. 7 is a reference diagram for explaining the application of the present invention regarding a systematic code. As shown in FIG. 7, a systematic code is configured such that input data is included in a part of the systematic code and parity bits are included in the remaining part of the systematic code. Specifically, FIG. 7 shows a case in which input data is encoded using channel code 1 (CC1) and then output data, which is obtained by encoding the input data using the CC1, is additionally encoded using channel code 2 (CC2).

This systematic code has an advantage in that at least part of the decoding process can be omitted according to a channel state. For example, in FIG. 7, when codeword 2 is received, if there is no error in a systematic portion of codeword 1 due to an excellent channel state, the input data can be restored by omitting a process for decoding the CC1 and CC2.

Although channel codes have different decoding complexity, the channel codes generally have complexity greater than linear one due to a data length used in the decoding process. Therefore, by omitting the decoding process and at the same time, decreasing a codeword length, complexity can be significantly reduced.

Figure 1:
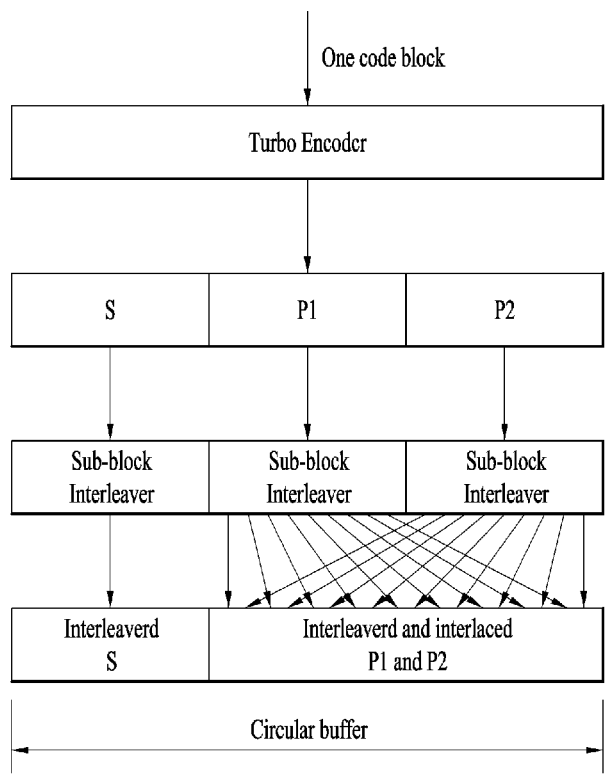
FIG. 1 is a conceptual diagram illustrating basic operations of a turbo encoder.
Figure 2:
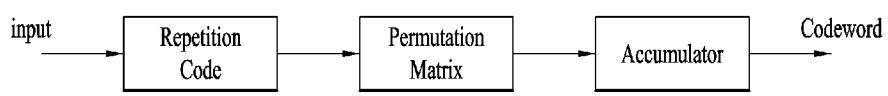
FIG. 2 is a reference diagram for explaining a repetition accumulate (RA) code.

The codeword 1 of FIG. 7 can be considered as output of the turbo code (TC) of FIG. 5, and the codeword 2 of FIG. 7 can be considered as output of the new CC of FIG. 2. In addition, it is assumed in the following description that a transmitter transmits the codeword 2 of FIG. 7.

Additionally, a description will be given of a method for using a systematic code with reference to the following first and second embodiments.

First Embodiment—UE's Selective Decoding According to Sudden Channel Changes

According to the first embodiment of the present invention, when UE-specific link adaptation cannot be accurately performed (for example, CSI outdating (e.g., high speed movement) and no CSI feedback or course CSI information (e.g., broadcasting information, D2D, V2V, etc.)), if a code rate or code index that exactly satisfies a target BER is not also transmitted, a transmitting end can transmit a more robust codeword at a code rate equal to or lower than exact code rate (i.e., use of additional parity). Thereafter, to perform decoding, a UE can perform channel measurement or error vector magnitude (EVM) measurement, refer to a predefined table for the code rate and code index satisfying the target BER, and use a code rate or codeword index suitable for its situation (i.e., UE's situation).

For example, considering the appropriate code rate and code index, when the codeword 2 is transmitted in the environment in which the codeword 1 should be transmitted, a receiving end can decode only the CC1 regardless of whether there is an error in the systematic portion. In this case, a length of necessary data in received data can be obtained from the predefined table.

Second Embodiment—Data Transmission in a Broadcast Environment

Figure 8:
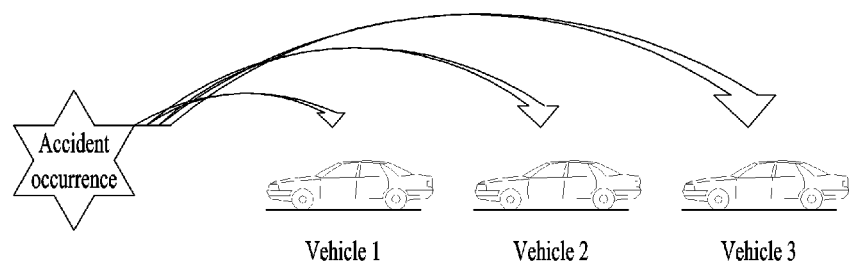
FIG. 8 is a reference diagram for explaining broadcasting according to the present invention.
Figure 9:
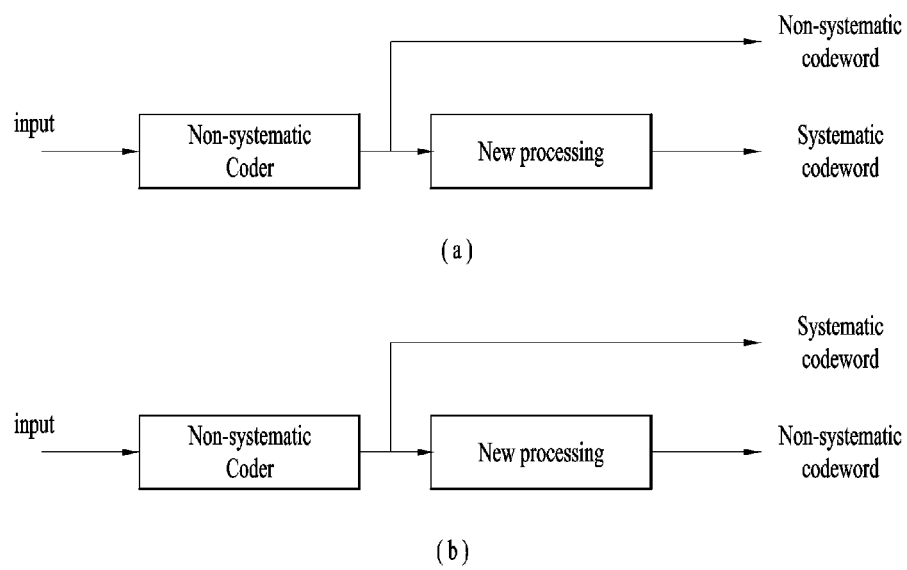
FIG. 9 illustrates encoder structures for concatenating a non-systematic code (with a configuration where input data of a code does not completely appear) and a systematic code according to the present invention.

In the second embodiment of the present invention, the broadcast environment shown in FIG. 8 such as vehicle to everything (V2X) is considered. That is, the broadcast environment where information on an accident is broadcasted through multiple channels is assumed. In this case, a signal path loss from a location where the accident occurs or a device that transmits information on the occurrence of the accident to each target device (e.g., vehicle) is changed (for example, distances to the individual vehicles are different from each other). In this case, although information may be transmitted to each vehicle using each link, it may be broadcasted because the same information is transmitted to all the vehicles. When the information is broadcasted, parity overhead is received from the perspective of vehicle 1 on the premise that vehicle 3 receives the information.

In this case, when transmission is performed by setting the target BER to $10^{-5}$ using code index 2 (turbo+processing+ new CC) for the vehicle 3, the vehicle 1 may receive the target BER set to $10^{-7}$ (if decoding is actually performed) because parity is increased 1 in the same situation. From the perspective of the target BER, it can directly go through a turbo decoder without passing through the new CC in a decoder, and thus the target BER can be set to $10^{-5}$. By doing so, the number of used decoders can be decreased, and thus power and decoding latency can also be reduced. In this case, the vehicle 1 may use the predefined table for a code rate and code index that satisfies the target BER.

In addition, whether an encoder used in the broadcast environment has a systematic form or not can be shared through signaling. Thus, the encoder can have a structure for concatenating a non-systematic code (with a configuration where input data of a code does not completely appear) and a systematic code.

Further, this can be applied to not only a PDSCH and PUSCH but also all types of channels where only a single channel code is used for the same channel (e.g., PDCCH, etc.).

The above-described embodiments may correspond to combinations of elements and features of the present invention in prescribed forms. And, it may be able to consider that the respective elements or features may be selective unless they are explicitly mentioned. Each of the elements or features may be implemented in a form failing to be combined with other elements or features. Moreover, it may be able to implement an embodiment of the present invention by combining elements and/or features together in part. A sequence of operations explained for each embodiment of the present invention may be modified. Some configurations or features of one embodiment may be included in another embodiment or can be substituted for corresponding configurations or features of another embodiment. And, it is apparently understandable that a new embodiment may be configured by combining claims failing to have relation of explicit citation in the appended claims together or may be included as new claims by amendment after filing an application.

In this disclosure, a specific operation explained as performed by a base station can be performed by an upper node of the base station in some cases. In particular, in a network constructed with a plurality of network nodes including a base station, it is apparent that various operations performed for communication with a user equipment can be performed by a base station or other network nodes except the base station. In this case, 'base station' can be replaced by such a terminology as a fixed station, a Node B, an eNodeB (eNB), an access point and the like.

The embodiments of the present invention may be implemented using various means. For instance, the embodiments of the present invention may be implemented using hardware, firmware, software and/or any combinations thereof. In case of the implementation by hardware, one embodiment of the present invention may be implemented by at least one of ASICs (application specific integrated circuits), DSPs (digital signal processors), DSPDs (digital signal processing devices), PLDs (programmable logic devices), FPGAs (field programmable gate arrays), processor, controller, microcontroller, microprocessor and the like.

In case of the implementation by firmware or software, one embodiment of the present invention may be implemented by modules, procedures, and/or functions for performing the above-explained functions or operations. Software code may be stored in a memory unit and may be then driven by a processor.

The memory unit may be provided within or outside the processor to exchange data with the processor through the various means known to the public.

It will be apparent to those skilled in the art that the present invention can be embodied in other specific forms without departing from the spirit and essential characteristics of the invention. Thus, the above embodiments are to be considered in all respects as illustrative and not restrictive. The scope of the invention should be determined by reasonable interpretation of the appended claims and all change which comes within the equivalent scope of the invention are included in the scope of the invention.

INDUSTRIAL APPLICABILITY

Although a channel coding method for a wireless communication system and apparatus therefor are mainly described with reference to examples applied to the 3GPP LTE system, the method and apparatus can be applied to various wireless communication systems as well as the 3GPP LTE system.

What is claimed is:

1. A method for a transmitting end device to transmit a first type signal for a first type wireless communication system and a second type signal for a second type wireless communication system, the method comprising:
   receiving, from a receiving end device, a configuration indicating a first type channel encoding and a second type channel encoding based on system requirements;
   performing the first type channel encoding for the first type signal to be transmitted via the first type wireless communication system;
   performing the second type channel encoding for both of the first type channel encoded-first type signal and the second type signal to be transmitted via the second type wireless communication system;
   transmitting the first type signal to the first type wireless communication system and the second type wireless communication system; and
   transmitting the second type signal to the second type wireless communication system,
   wherein the method further comprises:
   reconfiguring the second type channel encoding when the system requirements of at least one of the transmitting end device and the receiving end device are changed; and
   transmitting, to the receiving end device, information about the reconfigured second type channel encoding via a default channel to which only the first type channel encoding is applied.

2. The method of claim 1, wherein the system requirements comprise at least one of a target bit error rate, latency, a data type, a data size, a code rate, and reliability.

3. The method of claim 1, wherein the reconfiguring is performed when the receiving end device feeds back negative acknowledgement (NACK) during a predetermined unit time.

* * * * *